United States Patent
Marbell et al.

(10) Patent No.: US 7,986,186 B2
(45) Date of Patent: Jul. 26, 2011

(54) ADAPTIVE BIAS TECHNIQUE FOR FIELD EFFECT TRANSISTOR

(75) Inventors: Marvin Nii Nartey Marbell, High Point, NC (US); James Cheng-Min Hwang, Princeton Junction, NJ (US)

(73) Assignee: Lehigh University, Bethlehem, PA (US)

( * ) Notice: Subject to any disclaimer, the term of this patent is extended or adjusted under 35 U.S.C. 154(b) by 36 days.

(21) Appl. No.: 12/518,724

(22) PCT Filed: Dec. 13, 2007

(86) PCT No.: PCT/US2007/087421
§ 371 (c)(1),
(2), (4) Date: Jun. 11, 2009

(87) PCT Pub. No.: WO2008/076822
PCT Pub. Date: Jun. 26, 2008

(65) Prior Publication Data
US 2010/0085120 A1    Apr. 8, 2010

(51) Int. Cl.
*H03F 3/20* (2006.01)

(52) U.S. Cl. .................................. 330/136; 330/277
(58) Field of Classification Search .............. 330/136, 330/129, 277, 285, 296
See application file for complete search history.

(56) References Cited

U.S. PATENT DOCUMENTS

| | | | | |
|---|---|---|---|---|
| 3,436,681 A | * | 4/1969 | Hart | 331/117 FE |
| 3,789,246 A | * | 1/1974 | Preisig et al. | 327/543 |
| 4,763,327 A | * | 8/1988 | Fontaine et al. | 370/540 |
| 4,783,849 A | * | 11/1988 | Muterspaugh | 455/191.2 |
| 5,451,915 A | * | 9/1995 | Katzin et al. | 333/213 |
| 6,433,639 B1 | * | 8/2002 | Numanami et al. | 330/277 |
| 6,801,088 B2 | * | 10/2004 | Allen et al. | 330/277 |

* cited by examiner

*Primary Examiner* — Henry K Choe
(74) *Attorney, Agent, or Firm* — Duane Morris LLP

(57) ABSTRACT

A power amplifier includes a LDMOS transistor having a source, a drain, a control gate and a shielding electrode positioned between the control gate and the drain, and means for adaptively biasing the drain and shielding electrode power information for a RF signal.

21 Claims, 7 Drawing Sheets

Measured gain and efficiency for Vds = 5, 10, 15, 20 and 28 V left to right. Vgs = 4 V and Vg's = 0 V.

Measured gain and (a) efficiency and (b) third harmonic distortion for Vg' s= -5, 0, 5, 10 and 15 V left to right. Vds = 28 V, Vgs = 4 V.

Measured percentage increase in on resistance vs time for dummy gate voltage Vg's = 0, 5,10 and 15 V bottom up. Vds = 28 V Measured percentage increase in on resistance vs time for dummy gate voltage Vg's = 10 V, and drain voltage Vds = 28, 20 and 10 V top down.

Peak electric field at gate edge plotted vs dummy gate voltage for different drain voltages.

Curve showing trade-off in drain voltage and dummy gate voltage such that the peak electric field does not exceed $1.2 \times 10^5$ V/cm, and the degradation rate is kept at a minimum.

Measured voltages at the detector output, drain and dummy-gate as a function of swept input power.

Table of Results

|  | Average Power | Average Efficiency |
|---|---|---|
| No Adaptive Bias | 10.2 dBm | 23% |
| Adaptive Drain Bias | 10.1 dBm | 34% |
| Adaptive Dummy Gate Bias | 11.6 dBm | 24.5% |
| Combined Adaptive Drain and Adaptive Dummy Gate | 11.6 dBm | 39% |

Comparing gain and efficiency of a system with no adaptive bias to a system with (a) adaptive drain bias only and adaptive dummy gate bias only, and (b) combined adaptive drain and dummy-gate bias. RF frequency = 900 MHz, Vgs = 4 V, and maximum Vds = 20 V.

ADAPTIVE BIAS TECHNIQUE FOR FIELD EFFECT TRANSISTOR

CROSS-REFERENCE TO RELATED APPLICATIONS

This application claims priority to U.S. Provisional Patent Application No. 60/870,173 to Marvin Marbell and James Hwang, entitled "Adaptive Bias Technique for Field-Effect Transistors", filed Dec. 15, 2006, the entirety of which is hereby incorporated by reference herein.

FIELD OF THE INVENTION

The present invention relates to power field effect transistors and more particularly to power LDMOS transistors.

BACKGROUND OF THE INVENTION

Modern communication systems, such as cellular communication systems, utilize laterally diffused MOS transistors (LDMOS) as power amplifiers. LDMOSs have high voltage handling capacity made possible by the lightly doped drain (LDD) between the drain contact and the active channel. The LDD increases breakdown voltage at the expense of increased drain resistance. Extending the gate or drain electrode over the LDD decreases the drain resistance but increases the gate-drain and gate-source capacitances. Modern RF LDMOSs add a separate shield electrode (e.g., dummy gate or field plate) above the LDD to improve the drain resistance and decrease gate-drain capacitance, as in U.S. Patent Publication No. 2005/0280087A1 to Babcock et al., the entirety of which is hereby incorporated by reference herein. The shield electrode improves RF performance by acting as a shield between the gate and drain, thereby reducing the gate-drain capacitance and its associated Miller effect. In most cases, the shield electrode is connected to the source. In cases where the shield electrode is isolated from the source, the drain resistance can be further decreased by applying a positive bias on the shield electrode, without affecting the breakdown voltage significantly.

Modern communication systems employ complex modulation schemes to achieve high data rates within a limited bandwidth. These techniques result in significant variation in the envelope of the transmitted signal. Even with modulation schemes where the information is only embedded in the phase of the carrier, like QPSK and OFDM, the limited bandwidth of the transmitting system leads to variations in the envelope of the signal. The high peak-to-average ratio is a problem for the efficient operation of power amplifiers described above, which have to operate at reduced power levels in order to transmit the peak signals with acceptable linearity.

Several approaches have been proposed for dealing with the problem of low power amplifier efficiency due to high peak-to-average ratios. Amongst the most common of these approaches are the Doherty amplifier, Chireix's out phasing, envelope elimination and restoration, and adaptive bias techniques. With adaptive bias, the drain supply voltage continuously tracks the envelope of the incoming signal so that a low drain voltage is used at low power levels, thereby maintaining a higher average efficiency. This has been demonstrated in analog fashion, where a peak detected signal coupled from the input is suitably amplified and applied to the drain. Adaptive bias can also be done using DSP techniques, where the base-band processor directly controls the supply voltage. As an alternative to continuous voltage tracking, the drain supply can be switched to a higher supply unit at the onset of a peak signal. Adaptive biasing on the gate has also been implemented and has been used to enhance linearity, or fine tune a Doherty amplifier.

U.S. Pat. No. 5,898,198 discloses a RF power device having a positive voltage on the shielding electrode. This positive voltage reduces the on-resistance and leads to increases in the output power and maximum efficiency of the LDMOS. However, increasing the shielding electrode voltage with the drain voltage fixed at its typical quiescent value of 28V leads to a faster degradation of the on-resistance. The on-resistance degrades at a faster rate as the shielding electrode voltage is increased.

There remains a need for power amplifiers with improved performance and degradation characteristics.

SUMMARY OF THE INVENTION

A power amplifier includes a LDMOS transistor having a source, a drain, a control gate and a shielding electrode positioned between the control gate and the drain, and means for adaptively biasing the drain and shielding electrode responsive to power information for a RF signal.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
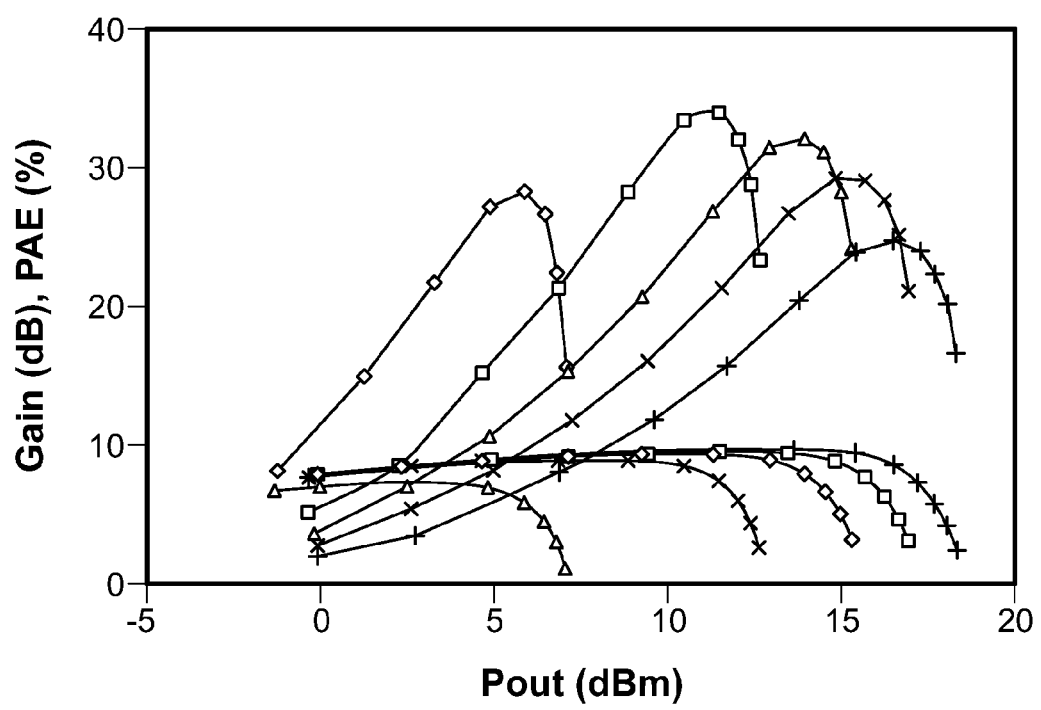
FIG. 1 shows the CW gain and efficiency curves at different drain voltages for a LDMOS power amplifier.

This description of the exemplary embodiments is intended to be read in connection with the accompanying drawings, which are to be considered part of the entire written description.

Techniques for adaptive biasing of LDMOS power transistors to improve the overall output power, efficiency, linearity and reliability are described herein. In exemplary embodiments, both the shielding electrode (which in embodiments is, by way of example, a dummy gate, shield plate or buried shield plate (collectively "shielding electrode")) and the drain are adaptively biased based on RF signal power information for the input or output RF signal.

In adaptive drain biasing systems, the quiescent drain voltage is modulated according to the envelope of the RF signal. For a fixed load $R_{OPT}$, different quiescent drain voltages will have different maximum voltage and current swings. So, the maximum drain voltage and current swings are functions of the quiescent drain voltage Vds. LDMOS based power amplifiers are typically operated in class AB mode, so assuming idealized transistor characteristics, the drain current waveform is cutoff at zero for about three-fifths of a cycle at high power levels. At lower power levels, there is not enough of a voltage swing on the gate to go below the threshold voltage and cutoff the drain current. So at lower power and drain voltages, the conduction angle increases and this contributes to a drop in efficiency. Efficiency also drops at low drain voltages because the knee voltage, which is a limit to the RF voltage swing, becomes more significant compared to the drain voltage. The implication on an adaptively drain biased system is that even though the range of high efficiency operation can be extended over a wider range, efficiency will still invariably decrease at low power levels.

The quiescent drain voltage used in a RF power amplifier has a significant impact on the maximum RF output power, efficiency and long-term degradation of the power amplifier. A higher quiescent drain voltage will give more room for voltage swing on the drain so a larger RF power is available from the power amplifier. Using larger widths of the active transistor or combining several stages in parallel will also give larger output power from the power amplifier, but this makes it more difficult to match the output to a 50 ohm load. Thus, systems that need several watts of RF power, such as cellular base-station applications, operate at a high drain voltage and need active transistors with a large breakdown voltage.

LDMOS transistors which are used in the majority of present day base-station power amplifiers typically operate at a quiescent drain voltage of 28V and have a breakdown voltage of 80V or higher. Operating at a high drain voltage leads to long-term degradation and reliability problems. The high electric field generated at the channel-drain interface contributes to hot-carrier injection which degrades the specific on-resistance and reduces the maximum RF output. Furthermore, a high quiescent drain voltage causes more DC power to be dissipated, thus increasing heat dissipation and reducing the efficiency of the power amplifier. Adaptively lowering the drain voltage at lower power levels contributes to both higher efficiency operation and reduced reliability problems.

FIG. 1 shows the continuous wave (CW), i.e., not pulsed, gain and power amplifier efficiency (PAE %) curves at different quiescent drain voltages. At the higher drain bias of 28V on the right, peak efficiency occurs at an output power of 16 dBm. At the fixed drain voltage of 28 V, if the power is backed off by 6 dBm, the efficiency drops to about half its value. However, if the drain voltage is lowered to 10 V, then at the lower power of 10 dBm, high efficiency operation is restored.

As the drain voltage is lowered, the maximum achievable efficiency rises through a peak and starts to decrease when the drain voltage goes below the saturation voltage of the transistor. This trend will be observed in power amplifiers where the load impedance is chosen for optimum power. The load required for optimum efficiency is often larger than the load for optimum power, so as the drain voltage is lowered, the maximum efficiency will peak when the chosen load matches the load for optimum efficiency at that drain voltage.

An adaptive drain bias system can be designed to track close to the peak efficiency or track the efficiency of a couple of dB backed off from the 1 dB compression point. Since device nonlinearities will be higher at peak efficiency, tracking close to the peak efficiency will inadvertently track the high nonlinearity as well. Tracking the efficiency a couple of dB back off from the compression point will give lower average efficiency but better overall linearity. The gain of the envelope amplifier used in the drain biasing can be adjusted to choose between this trade off.

Most RF LDMOS transistors have a field plate or dummy gate (collectively, "shielding electrode") that covers about a third of the lightly doped drain (LDD) region. This shielding electrode has a much thicker oxide than the main gate and is typically grounded to the substrate. The presence of the shielding electrode allows a higher doping of the LDD region with less tradeoff in breakdown voltage. It also lowers the gate-to-drain capacitance and suppresses hot carrier degradation.

When a positive voltage is applied to the shielding electrode, it has a similar accumulating effect as a p-channel MOSFET. Electrons are pulled closer to the surface, and the effective resistance of the LDD region is reduced. This, in turn, lowers the transistor's knee voltage and increases the maximum drain current. The RF current can therefore swing to higher values.

Figure 2:
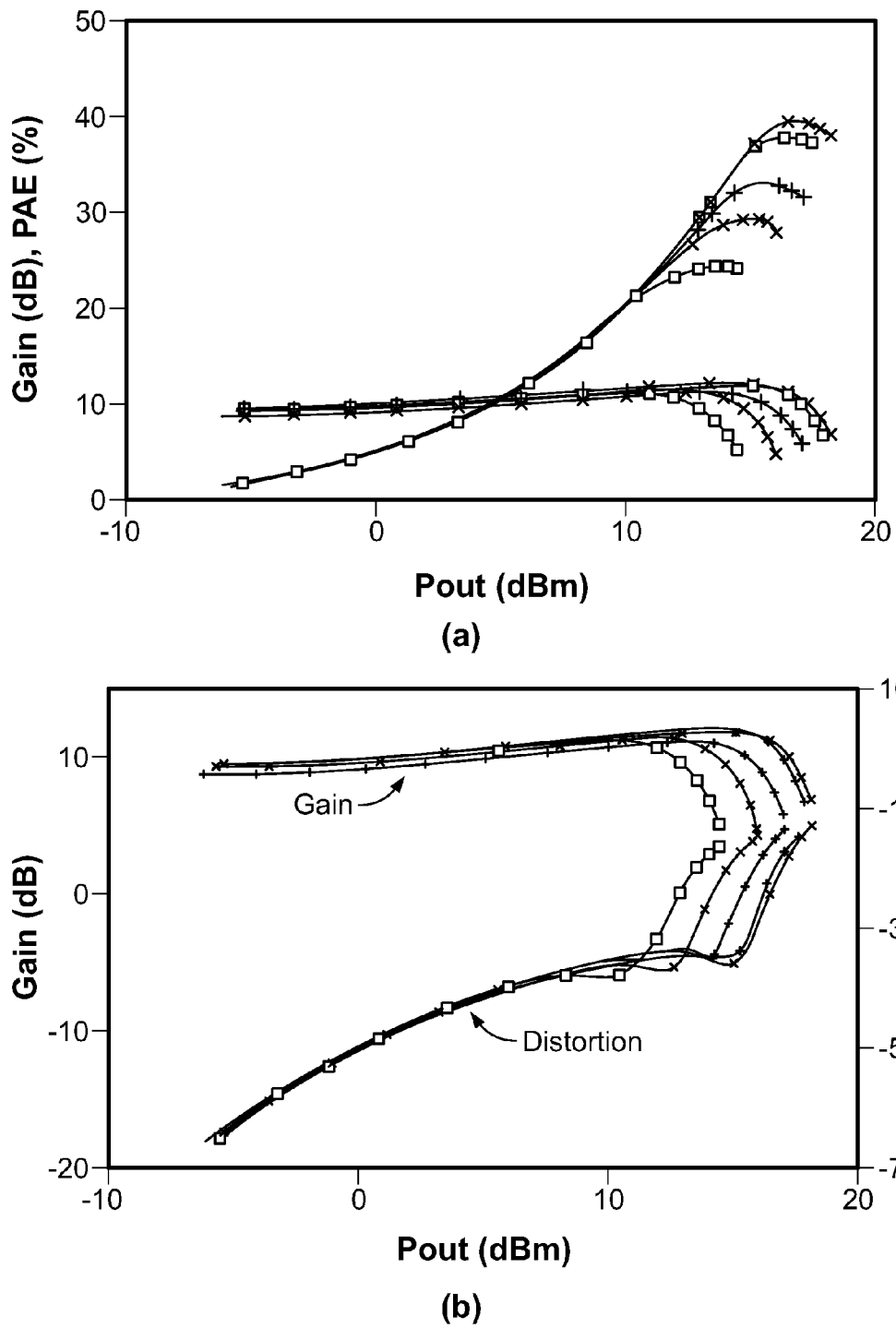
FIG. 2 shows the measured gain and (a) efficiency and (b) third harmonic distortion for various shielding electrode voltages for a LDMOS power amplifier.

As shown in FIG. 2, more positive voltage bias on the shielding electrode increases the maximum output power and efficiency. Negative voltage bias will also lower the maximum power and efficiency below what is achievable in the grounded shielding electrode case. LDMOS transistors at a class AB bias show a sweet spot in third order intermodulation distortion (IM3) and third harmonic distortion just before compression. The voltage bias on the shielding electrode can be used to control the occurrence of this sweet spot and move to higher or lower output power levels.

The effect of the shielding electrode bias on power, efficiency and linearity can be utilized in an adaptive shielding electrode bias technique, where the voltage bias on the shielding electrode is modulated according to the envelope of the RF signal. The LDMOS device can be operated closer to compression at the average signal power, and at the onset of a large peak signal a more positive voltage is applied on the shielding electrode so the signal is absorbed and linearity remains acceptable. Similar to adaptive drain bias, the envelope of the RF signal can be suitably amplified and applied to the shielding electrode. This increases the average efficiency and RF power at the acceptable linearity specification.

While the use of a positive voltage on the shielding electrode of a LDMOS reduces the on-resistance and leads to an increase in the output power and maximum efficiency of the LDMOSs, increasing the shielding electrode voltage with the drain voltage fixed at its typical quiescent value of 28V leads to a faster degradation of the on-resistance of the LDMOS.

Figure 3:
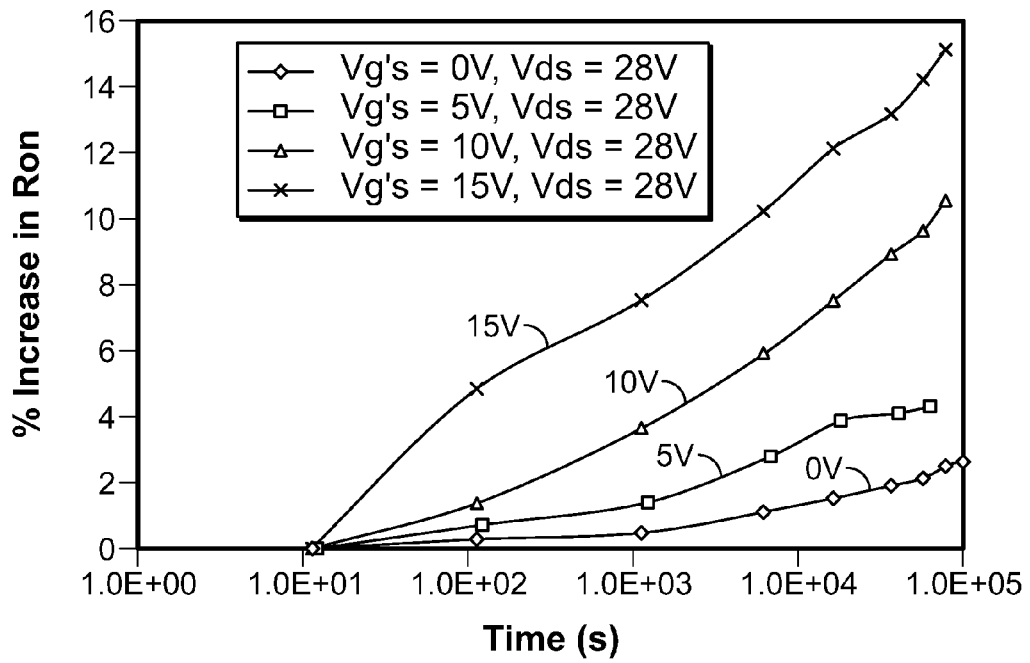
FIG. 3 is a graph of measured results showing the effects of shielding electrode biasing on the on-resistance of the LDMOS amplifier over a period of time with an applied fixed drain voltage.

FIG. 3 is a graph of measured results showing that with the shielding electrode voltage (Vg's) at 0V, the on-resistance degrades by 3% after 100,000 seconds of operation. The on-resistance degrades at a much faster rate as the shielding electrode voltage is increased. For example, at Vg's equal to 15V, on-resistance degrades by as much as 15% after 100,000 seconds of operation.

Figure 4:
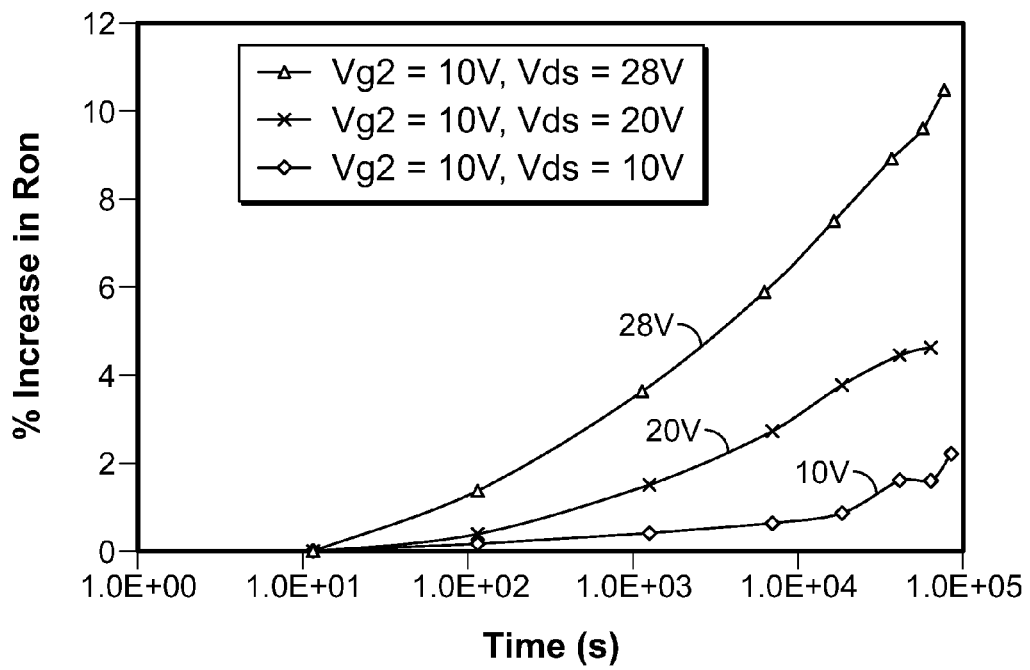
FIG. 4 is a graph of measured results showing the effects of drain voltage biasing on the on-resistance of the LDMOS power amplifier over a period of time with a fixed shielding electrode voltage.

The inventors also understand that the drain voltage has an effect on the rate of degradation of specific on-resistance. For a fixed shielding electrode voltage, reducing the drain voltage will reduce the rate of degradation. This is confirmed with experimental measurements at a fixed shielding electrode voltage and different drain voltages. FIG. 4 shows that with the shielding electrode voltage at 10 V and the drain voltage at 28 V, on-resistance degrades by 11% after 100,000 seconds of operation. The degradation rate reduces as the drain voltage is lowered so that with the drain voltage at 10 V, the degradation in on-resistance is less than 3% after 100,000 seconds of operation. This suggests that at reduced drain voltages, the shielding electrode voltage can be increased in a controlled manner without worsening the long term degradation.

Two-dimensional simulations can be used to understand the interaction between the drain voltage, shielding electrode voltage and degradation rate. A high peak field at the edge of the gate causes hot-carrier injection, which leads to the degradation in on-resistance. A more positive voltage on the shielding electrode increases the peak field at the gate edge. Larger peak fields cause more hot-carrier injection, leading to faster degradation in on-resistance. The total area covered by the electric field profile is proportional to the drain voltage (according to Poisson's equation), so by reducing the drain voltage, the peak electric field is also reduced. The inventors have learned that by monitoring the peak electric field as a function of different drain and shielding electrode voltages, it is possible to extract the combination of drain and shielding electrode voltages that will minimize the peak field and its associated degradation effects.

Figure 5:
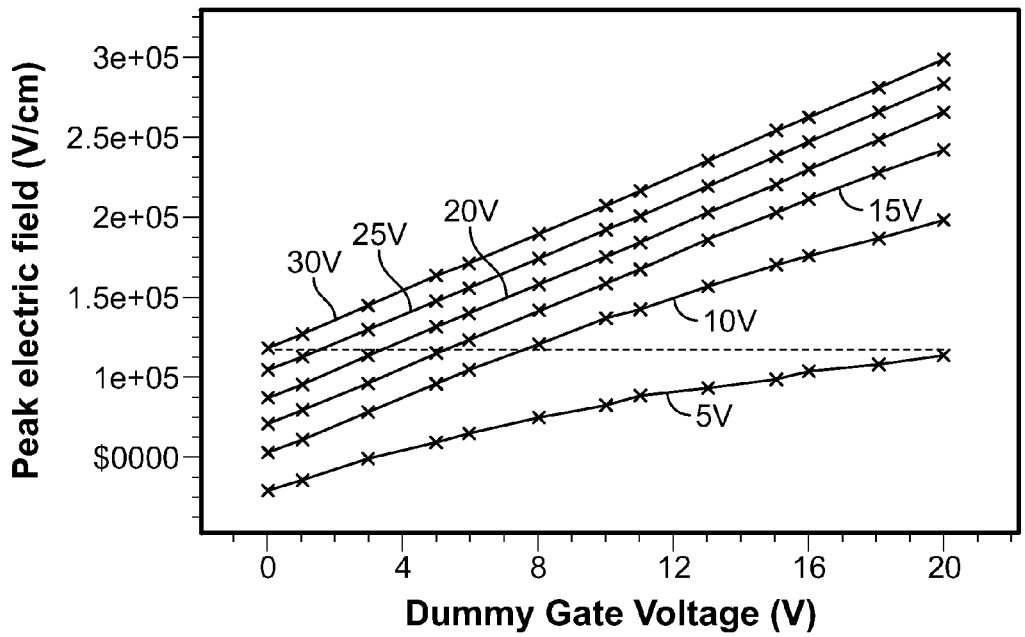
FIG. 5 shows the simulated results of peak electric field at the gate edge plotted versus the shielding electrode voltage for different drain voltages.
Figure 6:
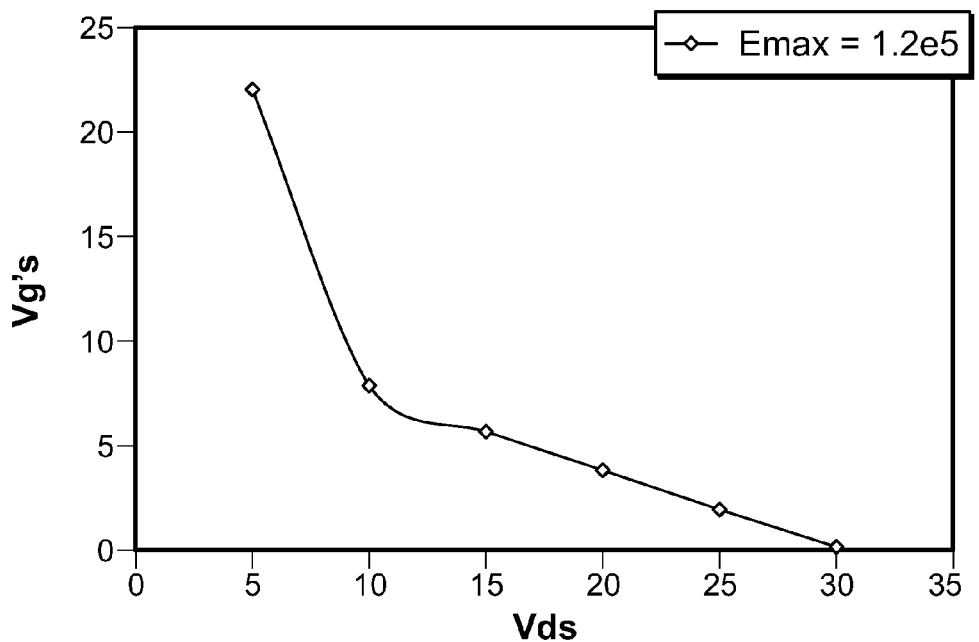
FIG. 6 shows a curve showing trade-off in drain voltage and shielding electrode voltage such that the peak electric field does not exceed a selected electric field value and the degradation rate is kept at a minimum.

FIG. 5 shows the peak electric field at the gate edge plotted as a function of shielding electrode bias for different drain voltages from 5V to 30V. By selecting a maximum peak electric field to correspond to the electric field present at shielding electrode voltage and 30V bias on the drain (represented by the horizontal dashed line of FIG. 5), a trade-off between drain and shielding electrode voltage can be established so that the selected maximum peak electric field is never exceeded. This will ensure that the combination of drain and shielding electrode voltages selected will lead to a degradation rate that is no worse than the degradation observed in the standard configuration, i.e., at shielding electrode voltage Vg's=0V and drain voltage Vds=28V. For each drain voltage in FIG. 5, the maximum shielding electrode voltage whose peak field does not exceed the maximum threshold (i.e., the dashed line) can be selected. This leads to the curve of shielding electrode voltage (Vg's) vs. drain voltage (Vds) shown in FIG. 6, which can be used as the trade-off criteria. FIG. 6's plot is generated using the data relating to acceptable Vg's and Vds combinations shown in FIG. 5.

The data in FIGS. 5 and 6 is obtained from a 2-D simulation that can only be done at a static DC point, Vg=0V in this case, so there is no RF input power associated with these graphs. However, the case where gate voltage equals 0V produces a peak field which is representative of the peak field at high input power. In reality, the gate voltage will be biased around 4V, and as the input RF power increases, the gate voltage will swing with increasing range around 4V, Only at very large input powers will the gate voltage swing to (or beyond) 0V.

So, by looking at the worst case (Vg=0V) and making sure degradation does not get worse than the case with no bias on the shielding electrode, the case of high input RF power is covered. Lower RF powers will cause less degradation.

In embodiments, the trade-off curve shown in FIG. 6 can be used in a combined adaptive drain bias and adaptive shielding electrode bias system that takes advantage of the reduced on-resistance and increased output power and efficiency at positive shielding electrode bias, without any sacrifice to the degradation rate. At low input signal power levels, the drain voltage is reduced so that the drain voltage excess is removed and high efficiency operation is maintained. At the reduced drain voltage, a limited amount of positive voltage can then be applied to the shielding electrode to improve the output power and efficiency without any increase in degradation rate in the specific on-resistance of the LDMOS transistor. An embodiment of a power amplifier applying these principles is illustrated in FIG. 7 and discussed below.

Figure 7:
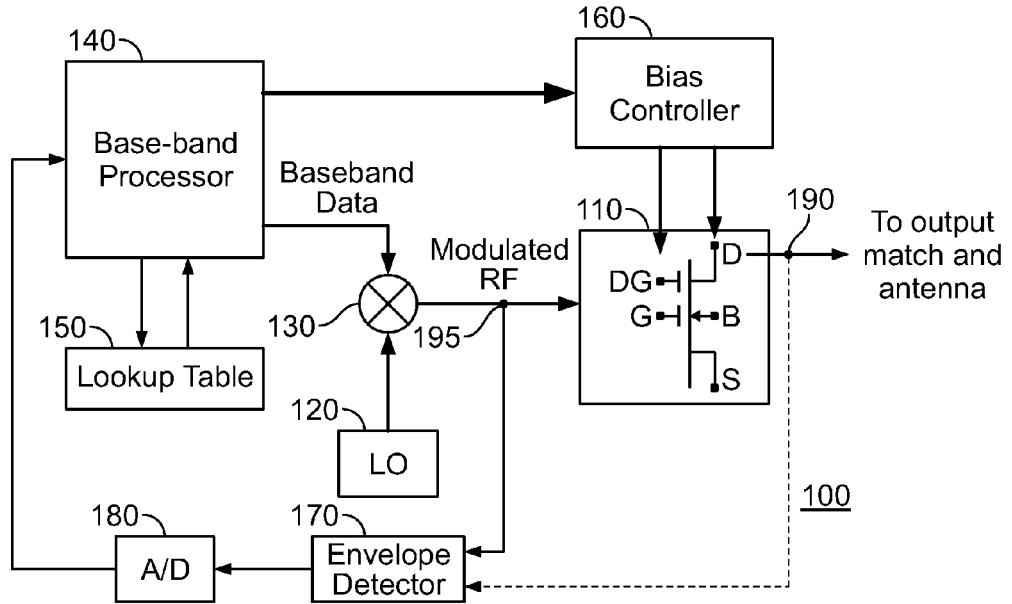
FIG. 7 illustrates an embodiment of a LDMOS transistor power amplifier system having both adaptive drain and shielding electrode biasing.

FIG. 7 shows a power amplifier system 100 for providing both adaptive drain and shielding electrode biasing to a LDMOS device. The system of FIG. 7 includes a LDMOS transistor 110, such as is disclosed in, for example, U.S. Published Application No. 2005/0280087 A1 to Babcock et al. or U.S. Pat. No. 7,126,193 to Baiocchi et al., the entirety of both of which are hereby incorporated by reference herein. As those skilled in the art will recognize, the LDMOS transistor includes a source (labeled S), a drain (labeled D), a gate (labeled G) and a shielding electrode (labeled DG). The amplifier system includes a local oscillator 120, a mixer 130 a Base-band processor 140, lookup table 150 and bias controller 160. As will be understood by those in the art, the Base-band processor provides baseband digital data (e.g., digital voice data) to the mixer 130. This data is then mixed with the signal from local oscillator 120 to form the modulated RF signal. This modulated RF signal is provided to the gate terminal of the LDMOS transistor 110 for amplification. The amplified output signal is provided at the drain terminal D. To this point, the description of the operation of the system 100 is conventional.

In the system 100, the relationship between the drain and shielding electrode voltages, such as is shown in FIG. 6, is programmed into the look up memory table 150, which is accessed by the Base-band processor 140. As discussed above, the data from FIG. 6 assumes the worst case scenario for electric field, that is the gate voltage is 0V. The data shown in the plot of FIG. 6 can be used to populate a look up table 150 and correlated to RF signal power. Low RF signal power can be associated with locations on the graph of FIG. 6 where the drain voltage is lower and high RF signal power can be associated with locations on the graph of FIG. 6 where drain voltage is higher. Intermediate RF signal powers can be correlated to intermediate drain voltages from the plot of FIG. 6. The Base-band processor 140 provides appropriate instructions to the bias controller 160 that will set the voltages on the drain and shielding electrode voltage based on RF signal power.

As shown in FIG. 7, a directional coupler 195 couples the RF input signal to an envelope detector 170 (also known as a "peak detector") and the output signal from the envelope detector 170 is converted to a digital signal by A/D converter 180. The digital envelope signal is provided to the Base-band processor 140.

As those in the art will understand, an envelope detector is an electronic circuit that takes a high-frequency signal as input and provides an output which is the "envelope" of the original signal. The capacitor in the circuit stores up charge on the rising edge, and releases it slowly through the resistor when the signal falls. The diode in series ensures current does not flow backward to the input to the circuit. Most practical envelope detectors use either half-wave or full-wave rectification of the signal to convert the AC audio input into a pulsed DC signal. Filtering is then used to smooth the final result.

The Base-band processor 140 either continuously monitors the RF signal power or it monitors it periodically. The Base-band processor then looks up the correct combination of shielding electrode and drain voltages for a given RF signal power from table 150 and provides a control signal to the Bias Controller 160, which then modulates the shielding electrode and drain voltages accordingly. In operation, the Base-band processor 140 acquires information about the RF signal power of the input signal, then accesses the look up table 150 to determine the optimum combination of drain voltage and shielding electrode voltage for that RF signal power, and then provides a control signal to the Bias Controller 160, which controls the DC voltage at the shielding electrode and drain of the transistor 100 in accordance with the control signal.

In an alternative embodiment of the amplifier system shown in FIG. 7, a coupler 190 is provided at the output, i.e., at the drain D, for coupling the output RF signal to envelope detector 170. In this feedback embodiment, the Base-band processor 140 monitors the output RF power for controlling the active biasing of the shielding electrode and drain.

In alternative embodiments, the lookup table 150 is populated with data by monitoring the degradation of the LDMOS transistor specific on-resistance over time for different drain and shielding electrode voltage combinations and for different RF power levels (as opposed to just zero RF power as used in generating the data of FIGS. 5 and 6). Data such as shown in FIG. 6 can be obtained for different RF signal powers. In this embodiment, the lookup table 150 includes drain and shielding electrode voltage data points for each RF signal power level for best degradation results. The proper shielding electrode and drain voltages are obtained by the Base-band processor 140 from the lookup table 150 based on the detected RF signal power from the input or output RF signal.

By actively biasing, and separately controlling, the shielding electrode and the drain of the transistor 100, the system only provides high potentials to the shielding electrode when, according to the control data in the lookup table, the degradation in the transistor will not worsen. For example, when the input power is below a peak power, the system can afford to lower the drain voltage, which then allows an increase in the shielding electrode voltage without negative affects on degradation, as shown in FIGS. 5 and 6.

In yet another embodiment, the look-up table 150 is populated with data points from a desired operational set (e.g., desired linearity, power, and/or efficiency, etc.) such as shown in, for example, FIG. 9 and described below in connection with the embodiment of FIG. 8.

From the foregoing, it should be understood that the lookup table 150 can be programmed with drain electrode and shielding electrode voltage combinations correlated to RF signal power to obtain the desired operating characteristics of the amplifier, whether it be degradation over time, improved efficiency, improved output power, improved linearity or combination of these performance attributes.

Various examples of Bias Controller 160 will be readily familiar to those of ordinary skill in the art and need not be detailed herein. By way of example only, in one embodiment, the bias controller 160 can be a simple programmable voltage circuit including one or more variable resistors or a programmable resistance ladder. Lookup table 150 can be a simple ROM or RAM memory structure.

Figure 8:
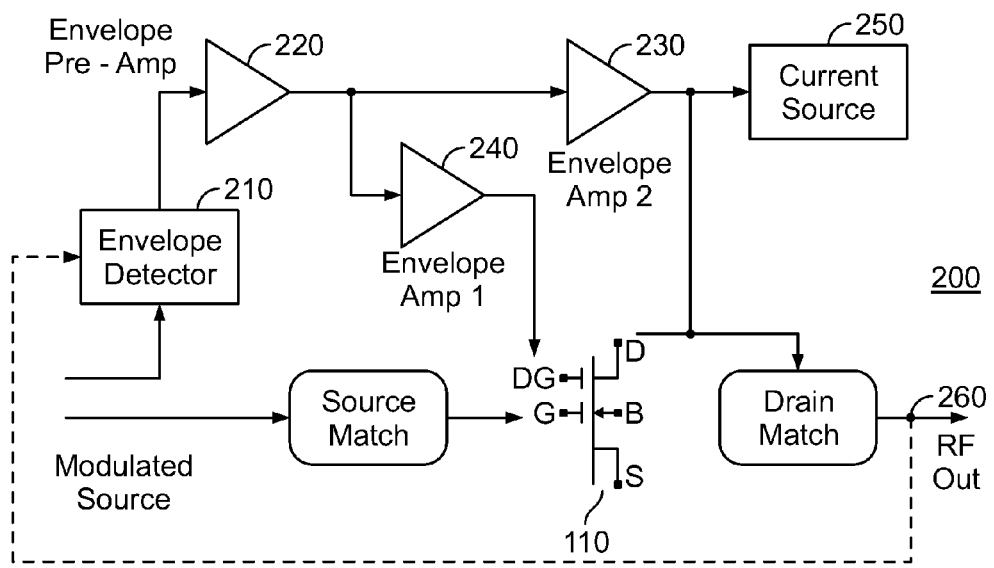
FIG. 8 illustrates an alternative embodiment of a LDMOS transistor power amplifier system having both adaptive drain and shielding electrode biasing.

Another embodiment of an adaptive bias setup for adaptively biasing both the drain and the shielding electrode of a LDMOS transistor is shown in FIG. 8. FIG. 8 shows a LDMOS amplifier 200 including a LDMOS transistor 110, which has a gate (G), shielding electrode (DG), drain (D) and source (S) contacts, an envelope detector 210, an envelope pre-amplifier 220, a shielding electrode amplifier 240, a drain amplifier 230 and a current source 250. As those skilled in art will understand, the load impedance seen from the drain and gate of the device should be optimized so that the transistor operates with maximum gain, efficiency, etc. The source and drain matches shown in FIG. 8 are impedance transformation networks that present the correct impedance to the transistor.

This setup of FIG. 8 was tested, as discussed hereafter. The LDMOS device was available only on wafer and was contacted via DC and RF probes. Maury load-pull tuners were used in matching the input and output to a 50 ohm measurement system. The envelope pre-amplifier 220 and main amplifiers 230, 240 were implemented with simple inverting and non-inverting, respectively, op-amp configurations using LM741 op-amps.

Figures 9, 11:
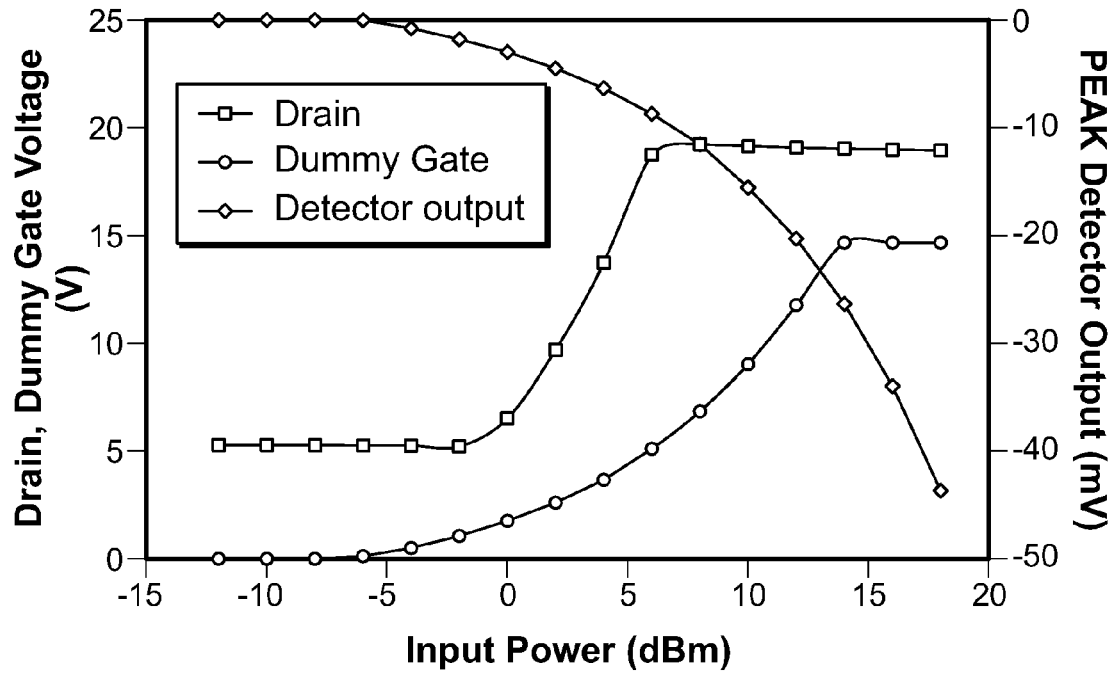
FIG. 9 shows various measured voltages in the amplifier of FIG. 8 across various input powers.
FIG. 11 is a table comparing results from various biasing techniques.

FIG. 9 shows the voltages at the drain, shielding electrode and output of the envelope detector as the RF input signal power is swept. The envelope detector 210 produces a negative voltage in the millivolt range that is proportional to the envelope of the input signal. This signal is inverted and amplified by the envelope pre-amp 220, and then further amplified for the shielding electrode or the drain by envelope amplifiers 230 or 240, respectively.

Since the shielding electrode draws virtually no current even for large sized devices, a simple op-amp configuration is enough for adaptive shielding electrode biasing. However, on the drain, with a large device (e.g., about 60-100 mm wide), the current capability should be supplemented with a current source 250 and current sense in parallel, such as will be understood by those of ordinary skill in the art.

For simpler and more linear implementation, the low voltage limit on the drain amplifier 230 can be clamped at 5 volts (as shown if FIG. 9) when it hits the lower rail limit of the op-amp supply. At higher power levels the drain and shielding electrode are clamped at 20V and 15V respectively. The gains of the envelope amplifiers are adjusted to control the rise of their output voltages with increasing signal power levels. They are designed to achieve reasonable efficiency and linearity at lower signal levels, and increased output power and efficiency at higher signal power levels. The gain of the amplifiers can be adjusted to achieve whatever voltage is desired on the drain and shielding electrode at a specific input power. For example, for the implementation of FIG. 9, the gains are set such that for an input power of 5 dBm, about 5V is provided to the shielding electrode and about 19V on the drain. These gains can be adjusted to achieve any particular Vds vs. Vgs shape.

The design of the amplifiers is affected by the goal of the tracking system, meaning if one wanted to have highest possible efficiency at each input power level and did not care about linearity, then the op-amps can be designed to track the peak of the efficiency curve, e.g., in FIG. 1. Or if a designer was more interested in having good linearity, then the designer can design the gain to track the dip in the third harmonic distortion curves (FIG. 2). A combination of amplifiers could also be provided to have a trade off in drain and shielding electrode voltage such as in FIG. 6, such as by using inverting and summing amplifiers. So, the same tracking pattern that the Base-band processor 140 and bias controller 160 achieve in the embodiment of FIG. 7 can be achieved through the correct amplifier combination and design in the embodiment of FIG. 8. Such analog designs, given the above-described criteria, are within the skill set of the ordinary analog designer.

Figure 10:
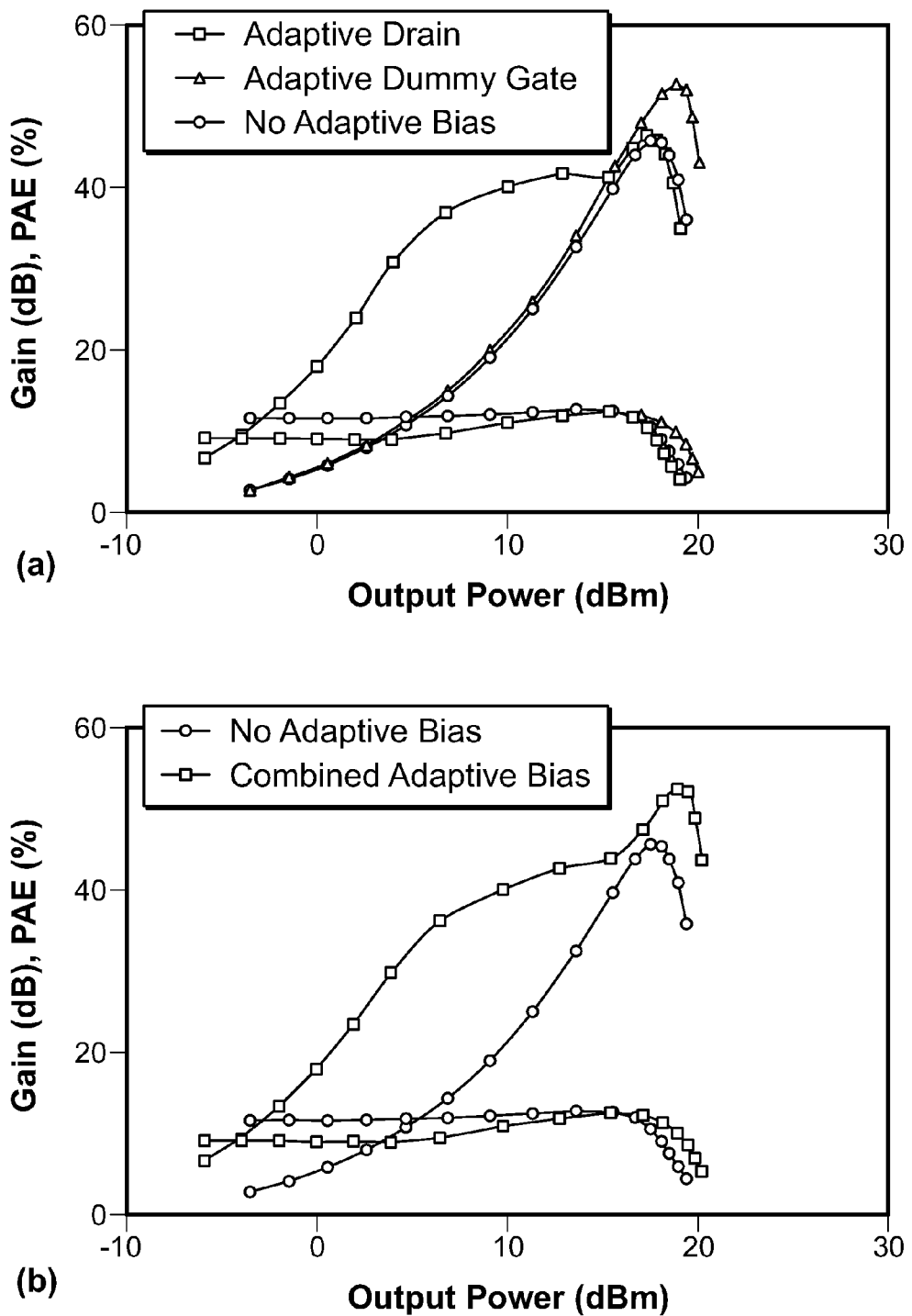
FIG. 10 shows a comparison of various biasing techniques.

The result of different adaptive bias systems for a 900 MHz RF signal are shown in the graph of FIG. 10 and the table of FIG. 11. In graph (a) of FIG. 10, gain and efficiency vs. swept power are compared for a system with no adaptive bias, with adaptive bias only on the drain, and with adaptive bias only on the shielding electrode. For only drain adaptive bias, there is no increase in the maximum efficiency and maximum output power. However, at lower power levels, higher efficiency is achieved over a 10+dB range. There is a trade off with linearity though, and the gain-compression curves shows more nonlinearity. Adaptive biasing of just the shielding electrode (called "dummy gate" in the graphs) looks identical to the situation of no adaptive bias, except at high power levels where a higher efficiency and maximum output power are achieved. The linearity of this system is improved.

Combining both adaptive drain bias and adaptive shielding electrode bias gives improved efficiency at lower power levels as well as a higher maximum efficiency and power at high power levels. The results of this combination for a swept power CW signal are shown in graph (b) of FIG. 10. The table of FIG. 11 compares the results with an AM modulated signal with a 9 dB peak-to-average ratio signal. Clearly combining drain and shielding electrode adaptive biasing gives the best average results for both power and efficiency.

In an alternative embodiment of the amplifier of FIG. 8, the output RF signal is provided from a directional coupler 260 to the envelope detector 210. This embodiment monitors output RF signal power, rather than input RF signal power, in adaptively biasing the shielding electrode and drain of LDMOS 110.

As discussed above, positive voltage bias on the shielding electrode brings benefits in terms of reduced on-resistance, increased RF power and efficiency. There is also little sacrifice to the breakdown and snapback voltage when the shielding electrode is kept below half of the breakdown voltage. However, there can be a trade off with long term degradation and reliability, as discussed above. The increase in total electric field at the channel-drain interface enhances hot-carrier injection and leads to a faster degradation in on-resistance, unless this is accounted for as discussed above in connection with the embodiment of FIG. 7. In any event, degradation has been observed even with LDMOS devices where the shielding electrode is always grounded. Suitable LDD profiles can be designed that will give acceptable degradation for positive bias on the shielding electrode while preserving the power, efficiency and linearity benefits of shielding electrode biasing. Also, degradation may not be a concern in applications where parts are routinely replaced or upgraded. Additionally, lower drain voltage can be traded for higher shielding electrode voltage without increasing the peak electric fields. So, in a combined adaptive drain and adaptive shielding electrode system, the shielding electrode can be biased to improve performance at reduced drain voltages while maintaining the same level of degradation and reliability, as discussed above in connection with the embodiment of FIG. 7.

An envelope tracking adaptive bias system is implemented that combines adaptive bias on the drain and shielding electrode of a RF LDMOS transistor to increase the average efficiency and output power from the device. The drain voltage is lowered at the low power levels to maintain high efficiency operation, and the shielding electrode bias is increased at high power levels to allow a larger voltage and current swings on the output of the device. This dual adaptive biasing approach enables higher output power and efficiency operation. In embodiments, the input RF signal is envelope detected, suitably amplified and applied to the drain and shielding electrode of the LDMOS. Tests with an amplitude modulated signal having a 9 dB peak-to-average ratio showed an average efficiency of 39% and 1.5 dB increase in output power. In other embodiments, information relating to the power of the RF signal is used to tune the drain and shielding electrode to appropriate combinations that improve efficiency, power and linearity while maintaining degradation at levels no worse than standard biasing techniques (e.g., grounded shielding electrode and 28V drain voltage).

In alternative embodiments, rather than a feed forward of information relating to the RF signal input power, a feed-back of information relating to RF signal output power can be employed.

The increase in output power through the above-described biasing techniques translates to a greater coverage area for, for example, cellular base stations that use power amplifiers employing these biasing techniques, and the improved efficiency reduces the heat dissipation and related reliability problems. These improvements can lead to a clearer and stronger signal on the consumer's cell phone and lower maintenance and deployment costs for cellular service providers.

From the foregoing, it should be understood that in embodiments the shielding electrode and drain can be adaptively biased to maximize the efficiency of the amplifier at low and high RF signal power levels. In other embodiments, the shielding electrode and drain can be adaptively biased to maximize linearity at low and high RF signal power levels. Long term degradation can also be accounted for in the design. Of course, tradeoffs between these conditions can also be designed into the adaptive biasing criteria.

In some embodiments, the increased power and efficiency shown for shielding electrode biasing suggests that, as an alternative to adaptive drain bias, adaptive dummy-gate biasing can be conveniently used in envelope-tracking schemes in lieu of adaptive drain biasing to improve the power and efficiency of digitally modulated LDMOS power amplifiers with a high peak-to-valley ratio. Adaptive shielding electrode biasing is more convenient than adaptive shielding electrode because the former does not involve high currents in the control video circuit. Adaptive shielding electrode biasing can be used to provide headroom for the occasional modulation peaks by boosting the maximum output power beyond what is normally possible with the maximum drain supply voltage. However, trade off between performance and reliability needs to be carefully made because the occasional peak power operation may eventually lead to irreversible degradation of the LDMOS. In addition, unlike adaptive drain biasing, adaptive shielding electrode biasing does not improve the efficiency at modulation valleys. Therefore, the preferred scheme involved both adaptive drain biasing and adaptive shielding electrode biasing. This approach allows the LDMOS to be operated, on average, closer to gain compression so that a smaller LDMOS can be used to reduce chip cost, power dissipation, and cooling requirements.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A power amplifier, comprising:
    a LDMOS transistor having a source, a drain, a control gate, and a shielding electrode positioned between the control gate and the drain; and means for adaptively biasing the drain and the shielding electrode responsive to signal power information for a RF signal,
wherein the signal power information comprises envelope information for the RF signal and the adaptively biasing means includes an envelope detector for detecting an envelope of said RF signal.

2. The power amplifier of claim 1, wherein the signal power information is derived from a RF signal inputted to the LDMOS transistor.

3. The power amplifier of claim 1, wherein the signal power information is derived from a RF signal outputted from the LDMOS transistor.

4. The power amplifier of claim 1, wherein the adaptively biasing means further comprises an envelope pre-amplifier coupled to an output of the envelope detector, and a pair of amplifiers coupled between an output of the envelope pre-amplifier and the drain and the shielding electrode.

5. The power amplifier of claim 4, wherein the output voltage from the amplifier that is coupled to the shielding electrode is clamped at a first selected positive voltage at high RF signal power levels and the output voltage from the amplifier that is coupled to the drain is clamped at second selected positive voltage at high RF signal power levels.

6. The power amplifier of claim 5, wherein the second voltage is higher than the first voltage.

7. The power amplifier of claim 5, wherein the output voltage from the amplifier that is coupled to the drain is clamped at a third selected positive voltage at low RF signal power levels, wherein the third selected positive voltage is less than the first and second selected positive voltages.

8. The power amplifier of claim 1, wherein the adaptively biasing means lowers a voltage applied to the drain at low RF signal power levels and increases a voltage applied to the shielding electrode at high RF signal power levels.

9. A power amplifier, comprising:
a LDMOS transistor having a source, a drain, a control gate, and a shielding electrode positioned between the control gate and the drain; and
means for adaptively biasing the drain and the shielding electrode responsive to signal power information for a RF signal,
wherein the adaptively biasing means comprises digital processing means responsive to RF signal power.

10. The power amplifier of claim 9, wherein the adaptively biasing means includes a bias controller responsive to a control signal from the digital processing means, the bias controller biasing the drain region and the shielding electrode in response to the control signal.

11. The power amplifier of claim 9, wherein the adaptively biasing means further includes a lookup table correlating RF signal power to bias levels for the drain region and shielding electrode.

12. A power amplifier, comprising:
a LDMOS transistor having a source, a drain, a control gate, and a shielding electrode positioned between the control gate and the drain; and
means for adaptively biasing the drain and the shielding electrode responsive to signal power information for a RF signal,
wherein the adaptively biasing means biases the drain and the shielding electrode based on a correlation between drain and shielding electrode voltages, RF signal power and degradation of a LDMOS transistor characteristic over time.

13. The power amplifier of claim 12, wherein the LDMOS transistor characteristic is specific on-resistance.

14. The power amplifier of claim 1, wherein the adaptively biasing means adaptively biases the shielding electrode and drain to maintain high efficiency at low and high RF signal power levels.

15. The power amplifier of claim 1, wherein the adaptively biasing means adaptively biases the shielding electrode and drain to maintain high linearity at low and high RF signal power levels.

16. A method of adaptively biasing a LDMOS transistor in an amplifier, the LDMOS transistor having a source, a drain, a gate and a shielding electrode, the method comprising the steps of:
monitoring signal power for a RF signal; and
simultaneously adaptively biasing both the drain and the shielding electrode of the LDMOS transistor in response to the signal power,
wherein the adaptively biasing step comprises the steps of detecting an envelope of the RF signal, and adaptively biasing the drain and the shielding electrode responsive to envelope information of the RF signal.

17. A method of adaptively biasing a LDMOS transistor in an amplifier, the LDMOS transistor having a source, a drain, a gate and a shielding electrode, the method comprising the steps of:
monitoring signal power for a RF signal; and
simultaneously adaptively biasing both the drain and the shielding electrode of the LDMOS transistor in response to the signal power,
wherein the adaptively biasing step comprises lowering a voltage applied to the drain at low RF signal power levels and increasing a voltage applied to the shielding electrode at high RF signal power levels.

18. A method of adaptively biasing a LDMOS transistor in an amplifier, the LDMOS transistor having a source, a drain, a gate and a shielding electrode, the method comprising the steps of:
monitoring signal power for a RF signal; and
simultaneously adaptively biasing both the drain and the shielding electrode of the LDMOS transistor in response to the signal power,
wherein the adaptively biasing step comprises the step of biasing the drain and the shielding electrode based on a correlation between drain and shielding electrode voltages, RF signal power and degradation of a LDMOS transistor characteristic over time.

19. The method of claim 16, wherein the adaptively biasing step comprises adaptively biasing the shielding electrode and drain to maintain high efficiency at low and high RF signal power levels.

20. The method of claim 16, wherein the adaptively biasing step comprises adaptively biasing the shielding electrode and drain to maintain high linearity at low and high RF signal power levels.

21. A power amplifier, comprising:
a LDMOS transistor having a source, a drain, a control gate, and a shielding electrode positioned between the control gate and the drain; and
means for adaptively biasing the drain and the shielding electrode responsive to signal power information for a RF signal,
wherein the adaptively biasing means lowers a voltage applied to the drain at low RF signal power levels and increases a voltage applied to the shielding electrode at high RF signal power levels.

* * * * *